United States Patent [19]

Clawson et al.

[11] 4,263,064
[45] Apr. 21, 1981

[54] METHOD OF LIQUID PHASE EPITAXIAL GROWTH

[75] Inventors: Arthur R. Clawson; Wing Y. Lum, both of San Diego; Gerald E. McWilliams, Corona, all of Calif.

[73] Assignee: The United States of America as represented by the Secretary of the Navy, Washington, D.C.

[21] Appl. No.: 122,222

[22] Filed: Feb. 19, 1980

[51] Int. Cl.³ .................................... H01L 21/208
[52] U.S. Cl. ................................ 148/171; 148/172
[58] Field of Search .................... 148/171, 172, 1.5

[56] References Cited

U.S. PATENT DOCUMENTS

| 3,077,384 | 2/1963 | Enk et al. | 148/172 X |
| 3,664,294 | 5/1972 | Solomon | 148/171 X |
| 3,975,218 | 8/1976 | Ruehrwein | 148/175 |
| 4,004,953 | 1/1977 | Otsubo et al. | 148/172 |
| 4,072,544 | 2/1978 | DeWinter et al. | 148/171 |
| 4,142,924 | 3/1979 | Hsieh | 148/171 |

Primary Examiner—G. Ozaki
Attorney, Agent, or Firm—Richard S. Sciascia; Ervin F. Johnston; Thomas Glenn Keough

[57] ABSTRACT

An improved method of liquid phase epitaxial growth of III-V compound on an InP substrate by growing the epitaxial layer in an atmosphere of $H_2$ with $10^{-5}$ to $10^{-4}$ mole fraction $PH_3$.

8 Claims, 1 Drawing Figure

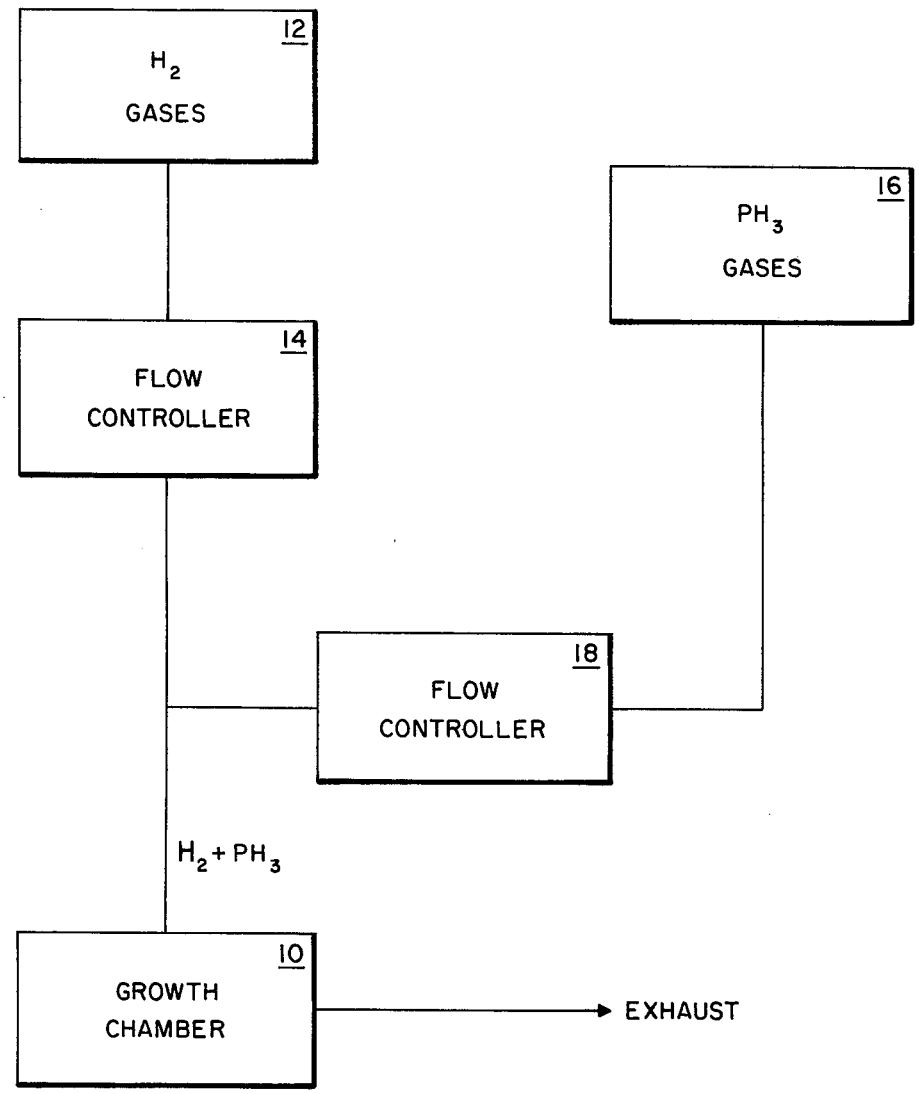

METHOD OF LIQUID PHASE EPITAXIAL GROWTH

BACKGROUND OF THE INVENTION

There is an increasing interest in InP epilayers for microwave devices and InGaAsP epilayers for photoelectronic emitters and detectors. The polished surfaces of InP used as substrates on which these epitaxial layers are grown, deteriorate at typical growth temperatures.

The InP slowly dissociates when heated above 450° C. with the phosphorus passing as vapor into the surrounding hydrogen. The remaining indium coalesces into droplets and forms etch pits, typically a few micrometers deep, on the InP surface. The surface of the InP is no longer smooth and flat, and an epilayer grown on this substrate will both conform to the surface roughness and contain crystallographic defects which propagate from the damaged substrate surface. Most electronic device applications require an epilayer that is planar, defect-free and uniformly thick with thickness dimensions of 0.2 to 5 $\mu$m. This planar geometry allows electrical conducting and gating contacts to be applied to the semiconducting layer surface with the use of photolithographic techniques to define both discrete and integrated device configurations. However, the surface must be smooth and flat for this technology. Crystallographic defects and nonuniform layer thickness degrade the electrical transport properties of the semiconductor by increased scattering of the charge carriers and inhomogeneity of the electrical field distribution. Epilayers that are free of surface roughness and defects are necessary for device quality semiconductor material.

SUMMARY OF THE INVENTION

The present invention provides for a process of liquid phase epitaxial growth of III-V compounds on an InP substrate without surface deterioration of the InP substrate. An InP substrate having a polished surface is heated in an atmosphere of hydrogen with $10^{-5}$ to $10^{-4}$ mole fraction of phosphine gas to a temperature suitable for growing the epitaxial layers. This temperature is maintained until the required thickness of the epitaxial layer has been grown.

OBJECTS OF THE INVENTION

An object of the present invention is the provision of an improved method of liquid phase epitaxial growth of III-V compound on an InP substrate.

Another object of the invention is the provision of a method of liquid phase epitaxial growth of III-V compounds on an InP substrate wherein the integrity of the polished surface of the substrate is maintained throughout the layer growing process.

A further object of the invention is the provision of an improved method of liquid phase epitaxial growth of III-V compounds on InP substrate by carrying out the growth process in an atmosphere of hydrogen with $10^{-5}$ to $10^{-4}$ mole fraction phosphine gas.

Other objects and many attendant advantages of this invention will be readily appreciated as the same becomes better understood by reference to the following detailed description when considered in connection with the accompanying drawings.

BRIEF DESCRIPTION OF THE DRAWINGS

The single FIGURE is a gas flow diagram in accordance with the teaching of the invention.

DESCRIPTION OF THE PREFERRED EMBODIMENT

The epitaxial growth of III-V compounds such as InP, InAsP, and InGaAsP on InP substrates without degradation of the polished substrate may be accomplished by the normal liquid phase epitaxial process. An example of the process embodying the invention is described.

A polished InP single crystal wafer substrate (seed crystal) is selected. The InP substrate is cleaned to remove any contamination from handling by (a) 2 rinses in trichloroethylene,
(b) 2 rinses in acetone,
(c) water rinse,
(d) methanol rinse and
(e) blow dry with pure nitrogen.

Surface oxides are chemically removed from the InP substrate by (a) a preferential oxide etch in hot KOH (potassium hydroxide) contained in a vitreous graphite beaker for 1 minute
(b) methanol rinse
(c) 10 second etch in ½ volume percent bromine-methanol solution
(d) methanol rinse
(e) blow dry with pure nitrogen.

The InP substrate is then immediately placed in the graphite slide boat of a quartz tube growth chamber which already contains an indium growth solution containing an appropriate amount of phosphorus to saturate the solution at a growth temperature in the range of 500° to 700° C.

The quartz growth chamber containing the graphite boat is purged to remove the air by (a) vacuum exhaust the chamber to less than $5 \times 10^{-3}$ torr,
(b) backfill with purified hydrogen and
(c) flow hydrogen at a rate of 0.5 to 1 liter per minute for a minimum of 1 hour to remove residual oxygen and water vapor.

The graphite boat is then heated to 20° C. above the liquidus of the growth solution by rolling the heated tube furnace over the growth chamber. The solution liquidus is the temperature at which the saturated-liquid and the solid InP in contact therewith are in equilibrium. The temperature is a function of the amount of phosphorus dissolved in the indium solution. To choose a growth temperature the appropriate amount of phosphorus is determined from the published liquidus data and solid InP in this amount is added to the indium. Alternatively, the phosphorus can be added to the heated indium by introducing approximately $10^{-3}$ mole fraction PH$_3$ to the growth chamber for 3 to 4 hours until solid InP is observed floating on the liquid surface. The PH$_3$ flow is then discontinued and the temperature slowly increased until the solid InP barely melts. This has been determined to be within 1° C. of the liquidus.

When the chamber is heated to within 1° C. of the liquidus, a fraction of PH$_3$ is added to the hydrogen to provide a protective atmosphere to the solid InP (this protects the substrate before growth and the epilayer surface after growth). The amount of PH$_3$ necessary increases with the growth temperature used. Typically, layers are grown at 650° C. with 50 ppm PH$_3$ in the hydrogen. This PH$_3$ fraction is slightly more than is necessary thus providing some margin for error. It is also important that this amount of PH$_3$ does not noticeably change the liquidus temperature in the approximately one hour period used to grow the layer as would (and does) occur if much higher PH$_3$ concentrations are used.

The temperature of the boat is then allowed to level off (as measured with a thermocouple in the boat) for about 5 minutes. The solution is observed to confirm that all the solid is melted, then the furnace controller set point is adjusted to a temperature from 7° to 10° C. below the solution liquidus. The temperature is allowed to level off for about 10 minutes to assure that the solution, graphite boat and substrate have reached the same temperature.

The slider portion of the boat is then positioned to contact the substrate to the bottom of the 7° to 10° C. supercooled growth solution to initiate epilayer growth. The solution supersaturation resulting from cooling the solid-free melt below its liquidus provides the driving force for growth of the epitaxial layer.

After a growth time appropriate for the desired layer thickness, the slider is moved to separate the substrate from the melt thus terminating the growth. The time ranges from ~5 seconds for a ½ μm layer to 10 minutes for a 10 μm layer.

The furnace is rolled off the graphite boat to allow it to cool to room temperature. When the graphite boat is cooled below 200° C. the PH$_3$ is shut off and pure hydrogen used to purge the toxic PH$_3$ from the chamber for the remaining ~15 minutes as the boat cools to room temperature. The hydrogen is displaced with nitrogen before the chamber is opened and the epilayer removed.

As shown in the block diagram of the drawing, a source of high purity hydrogen gas 12 and a source of high purity phosphine gas 16 are metered by flow controllers 14 and 18 and mixed together to provide hydrogen with 10$^{-5}$ to 10$^{-4}$ mole fraction phosphine. This hydrogen-phosphine mixture flows through the growth chamber 10 to provide the ambient gas for liquid phase epitaxial layer growth on InP substrates free of thermal degradation.

The source of phosphine 16 is a commercial mixture of ½ percent phosphine and 99½ percent hydrogen. This minimizes the phosphine concentration for safety in working with this toxic gas and simplifies the metering of the gas by increasing the necessary volume to a level which can be controlled by available controller.

Obviously, many modifications and variations of the present invention are possible in the light of the above teachings. It is therefore to be understood that within the scope of the appended claims the invention may be practiced otherwise than as specifically described.

What is claimed is:

1. In a method of growing a layer of crystal by liquid phase epitaxy upon an InP substrate wherein the crystal layer is grown by contacting the substrate with a saturated solution of a III-V compound containing phosphorus, the improvement comprising the steps of:
    (a) heating the solution and substrate in a growth chamber to the liquidus temperature of the solution;
    (b) introducing an atmosphere comprising hydrogen with 10$^{-5}$ to 10$^{-4}$ mole fraction of PH$_3$ into the growth chamber, whereby the substrate surface is stabilized; and
    (c) bringing the solution and substrate into contact for epitaxially growing the crystal.

2. The method of claim 1 wherein said III-V compound is InP.

3. The method of claim 1 wherein said III-V compound is InAsP.

4. The method of claim 1 wherein said III-V compound is InGaAsP.

5. A method of stabilizing the surface of an InP substrate during a liquid phase epitaxial growth process in which a III-V compound containing phosphorus is grown on the substrate, comprising:
    (a) heating the substrate in a growth chamber to the liquidus temperature of a saturated growth solution from which the III-V compound is to be grown;
    (b) introducing an atmosphere comprising hydrogen with 10$^{-5}$ to 10$^{-4}$ mole fraction of PH$_3$ into the growth chamber; and
    (c) bringing the solution and substrate into contact for epitaxially growing the compound.

6. The method of claim 5 wherein said III-V compound is InP.

7. The method of claim 5 wherein said III-V compound is InAsP.

8. The method of claim 5 wherein said III-V compound is InGaAsP.

* * * * *